United States Patent [19]
Zook

[11] Patent Number: 4,845,714
[45] Date of Patent: Jul. 4, 1989

[54] MULTIPLE PASS ERROR CORRECTION PROCESS AND APPARATUS FOR PRODUCT CODES

[75] Inventor: Christopher P. Zook, Lafayette, Colo.

[73] Assignee: Exabyte Corporation, Boulder, Colo.

[21] Appl. No.: 59,454

[22] Filed: Jun. 8, 1987

[51] Int. Cl.⁴ .............................................. G06F 11/00
[52] U.S. Cl. ...................................... 371/50; 371/37
[58] Field of Search ....................... 371/37, 38, 39, 40, 371/50, 49, 51

[56] References Cited

U.S. PATENT DOCUMENTS

| | | | |
|---|---|---|---|
| 4,456,980 | 6/1984 | Yamada | 371/50 |
| 4,670,881 | 6/1987 | Imoto | 371/50 |
| 4,719,628 | 1/1988 | Ozaki | 371/50 |
| 4,742,517 | 5/1988 | Takagi | 371/37 |

Primary Examiner—Michael R. Fleming
Attorney, Agent, or Firm—Griffin, Branigan, & Butler

[57] ABSTRACT

An error correction system (20) comprises a multi-pass controller (32) which operates through a controller/decoder interface (34) to supervise the execution of decoding passes by a decoder (30). The multi-pass controller (32) employs a correction procedure comprising a plurality of hierarchial strategies S(1), S(2), . . . S(N) for transitioning the procedure through a plurality of predetermined states. Upon completion of a decoding pass, a pass evaluator (70) evaluates the results of the decoding pass and uses the evaluation for establishing values for further operation. Further passes are executed in accordance with further states determined by the multi-pass controller (32), the further states having particular parameters associated therewith including a strategy selection.

30 Claims, 6 Drawing Sheets

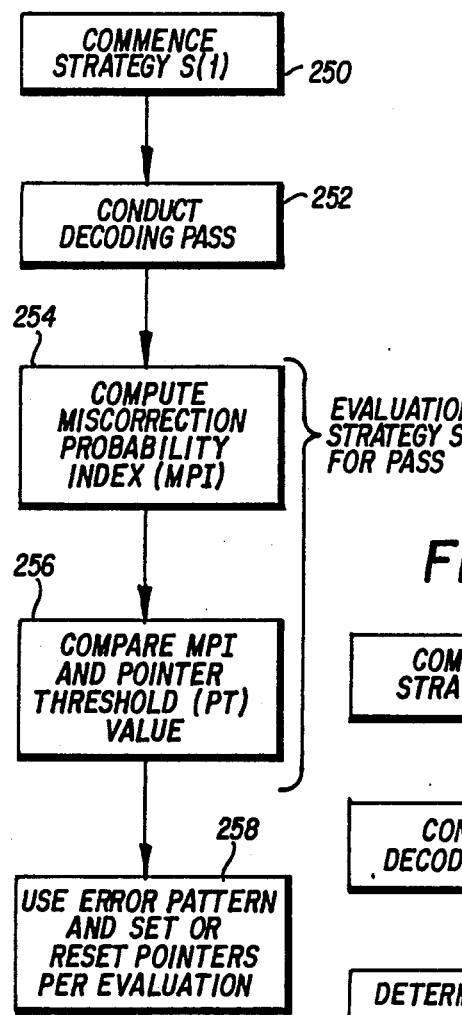
FIG. 7
FIG. 6
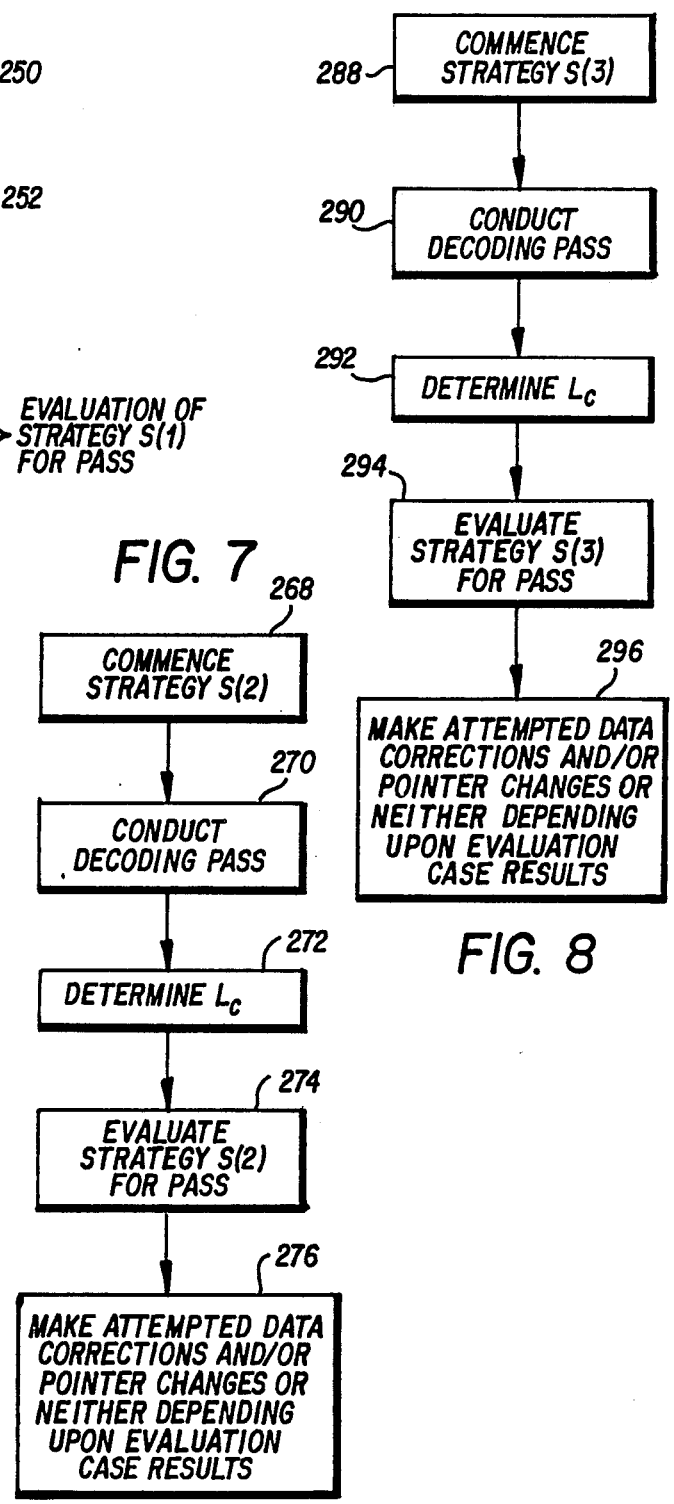
FIG. 8

MULTIPLE PASS ERROR CORRECTION PROCESS AND APPARATUS FOR PRODUCT CODES

FIELD OF THE INVENTION

This invention pertains to method and apparatus for decoding and correcting stored or transmitted codewords, and particularly to such method and apparatus wherein product codes are employed.

PRIOR ART AND OTHER CONSIDERATIONS

Noise occurring in the transmission of data, or in the storing and retrieving of data, can result in errors. Accordingly, various encoding techniques have been developed to specially encode the transmitted or stored data in order to afford an error correction capability.

In accordance with such encoding techniques, a set of message or information bits has a set of check bits appended thereto to form a codeword. The check bits for the codeword are derived by an encoder. In this regard, the encoder essentially treats the bits comprising the set of message bits as coefficients of a binary message polynomial and derives the check bits by operating on the message polynomial (as by multiplication or division) with a generator polynomial G(X). The generator polynomial is selected to impart desired properties to codewords upon which it operates so that the codewords will belong to a particular class of error-correcting binary groups codes.

One class of error correcting codes is the well-known BCH codes, which include Reed-Solomon codes. The mathematical basis of Reed-Solomon codes is expounded in Berlekamp, *Algebraic Coding Theory*, McGraw-Hill, 1968, and summarized in U.S. Pat. No. 4,162,480 to Berlekamp, the latter of which is incorporated herein by reference. According to this exposition, a Reed-Solomon code is one having a generator polynomial G(X) defined as follows:

$$G(X) = \prod_{i=1}^{d-1} (x - \alpha^i)$$

where $\alpha$ is a primitive element in the Galois Field $GF(2^m)$, and where d is the code's designed distance. Discussions of Reed-Solomon codes are also provided in other treatises such as Peterson and Weldon, *Error-Correction Codes*, Second Edition, The MIT Press, 1972, and Wakerly, *Error Detecting Codes, Self-Checking Circuits and Application*, North-Holland, 1978.

Reed-Solomon codes are capable of correcting erasures (errors whose locations are known) and errors simultaneously. A Reed-Solomon code with n-K check characters can correct v errors and u erasures as long as $2v + u \leq n-K$.

Two or more Reed-Solomon codes can be combined to produce a more powerful code. As shown in FIG. 1, information and check bits are conceptually arranged in an array so that the rows of the array are horizontal codewords, each horizontal codeword containing $K_H$ data bytes and $n_H - K_H$ error correction (ECC) bytes for a total codeword length of $H_H$ bytes. The columns of the array are vertical codewords containing $K_V$ data bytes and $n_V - K_V$ ECC bytes for a total vertical codeword length of $n_V$ bytes. The horizontal ECC bytes are also contained in vertical codewords and the vertical ECC bytes are also contained in the horizontal codewords. The lower right block in the matrix of FIG. 1 consists of ECC bytes generated over the horizontal and vertical ECC bytes. After generating the horizontal and vertical ECC bytes from the data, the "ECC on ECC" bytes are generated from the horizontal or vertical ECC bytes. Once generated, the matrix data is transmitted through a channel.

The combination of codes described above are known as "two-dimensional codes" or "product codes". Tutorial discussions of product codes are provided in numerous treatises, including those listed above.

In decoding a matrix or block of information operated upon by a product code, a decoder generally processes the rows of the block in a "horizontal pass" and the columns of the block in a "vertical pass". During each pass the decoder attempts to correct, in accordance with the applicable code for the pass, any detected errors. If, at the end of the first vertical pass, for example, some but not all of the errors are corrected, then another (second) horizontal pass can be made. A second horizontal pass is feasible because some row in the block which was not corrected during the first horizontal pass now has (as a result of the first vertical pass) fewer errors than were originally in that horizontal row. Thus, the error pattern in that horizontal row may now be reduced to a correctable error pattern.

In view of the foregoing, it can generally be surmised that whenever a pass in either direction corrects some errors but also leaves some errors uncorrected, then a pass in the other direction may be made. This process of repeated passes can continue until either no errors remain or a pass is made in which no errors are corrected.

Not all decoding applications lend themselves to methods of repeated or multiple passes, particularly applications wherein error correction must occur with optimum rapidity. For decoding applications wherein multiple passes are feasible, a strategy must be implemented for determining the number and nature of the passes. Examples of such strategies are set forth in literature such as that authored by Odaka, Kentaro et al. ["LSIs For Digital Signal Processing To Be Used In 'Compact Disc Digital Audio' Players"; Audio Engineering Society Reprint, March 1982] and Shenton, DeBenedictis, and Locanthi ["Improved Reed Solomon Decoding Using Multiple Pass Decoding", Audio Engineering Society Reprint, October 1983].

An object of the present invention is to provide method and apparatus for controlling the error correction of coded information which has been operated upon by product codes.

An advantage of the present invention is the provision of method and apparatus for implementing error correction strategies according to a hierarchial ordering of a plurality of such strategies.

Another advantage of the present invention is the provision of method and apparatus for utilizing erasure pointers in the process of error correction of coded information which has been operated upon by product codes.

SUMMARY

An error correction system comprises a multipass controller which operates through a controller/decoder interface to supervise the execution of decoding passes by a decoder. The multi-pass controller employs a correction procedure comprising a plurality of hierarchial strategies S(1), S(2), ... S(N) for transitioning the procedure through a plurality of predetermined states. Upon completion of a decoding pass, a pass evaluator evaluates the results of the decoding pass and uses the evaluation for establishing values for further operation. Further passes are executed in accordance with further states determined by the multi-pass controller, the further states having particular parameters associated therewith including a strategy selection.

In accordance with a highest ordered strategy S(1), input pointers are applied to the decoder for error location and correction purposes. Each decoding pass conducted in accordance with strategy S(1) is evaluated by comparing a Miscorrection Probability Index (MPI) value computed for each codeword with a predetermined pointer threshold (PT) value. The MPI=3L - F, where L is the number of errors detected in a codeword by the decoder during a coding pass, and where F is the number of codeword input pointers applied to the decoder for use during the pass.

Strategies other than strategy S(1) do not necessarily utilize available input pointers. Decoding passes conducted in accordance with these other strategies are evaluated by examining various parameters, including the number of available input pointers (F) and the number ($L_c$) of errors detected in the codeword by the decoder which were pointed to by available input pointers.

When a decoding pass is completed, the multi-pass controller analyzes certain input parameters to determine what state the correction procedure is next to assume. In particular, a next state logic section develops a next state value by utilizing a signal indicative of the current state value and a signal indicative of whether any correction changes were made during the last state. An output logic section applies appropriate signals on various output lines in accordance with the next selected state, which becomes the current state. Output signals applied by the output logic section include strategy enablement signals for enabling the one of the strategies associated with the state; a pass direction signal indicative of whether a horizontal or vertical pass is to be performed; and, if strategy S(1) is to be implemented, a pointer threshold (PT) value.

The error correction procedure is so structured that, should implementation of a strategy not result in the correction of any remaining errors, a next highest ranked strategy is implemented. If implementation of the next-highest ranked strategy results in error correction, the procedure again requires implementation of the highest order strategy and from thence implementation of lower order strategies until a codeword is corrected or determined to be uncorrectable.

BRIEF DESCRIPTION OF THE DRAWINGS

The foregoing and other objects, features and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

FIG. 6 is a schematic, diagrammatic view of steps executed in the implementation of a highest order error correction strategy S(1);

FIG. 7 is a schematic, diagrammatic view of steps executed in the implementation of an error correction strategy S(2);

FIG. 8 is a schematic, diagrammatic view of steps executed in the implementation of an error correction strategy S(3); and, FIG. 9 is a schematic, diagrammatic view showing an example implementation of an error correction procedure according to an embodiment of the invention.

DETAILED DESCRIPTION OF THE DRAWINGS

Figure 2A:
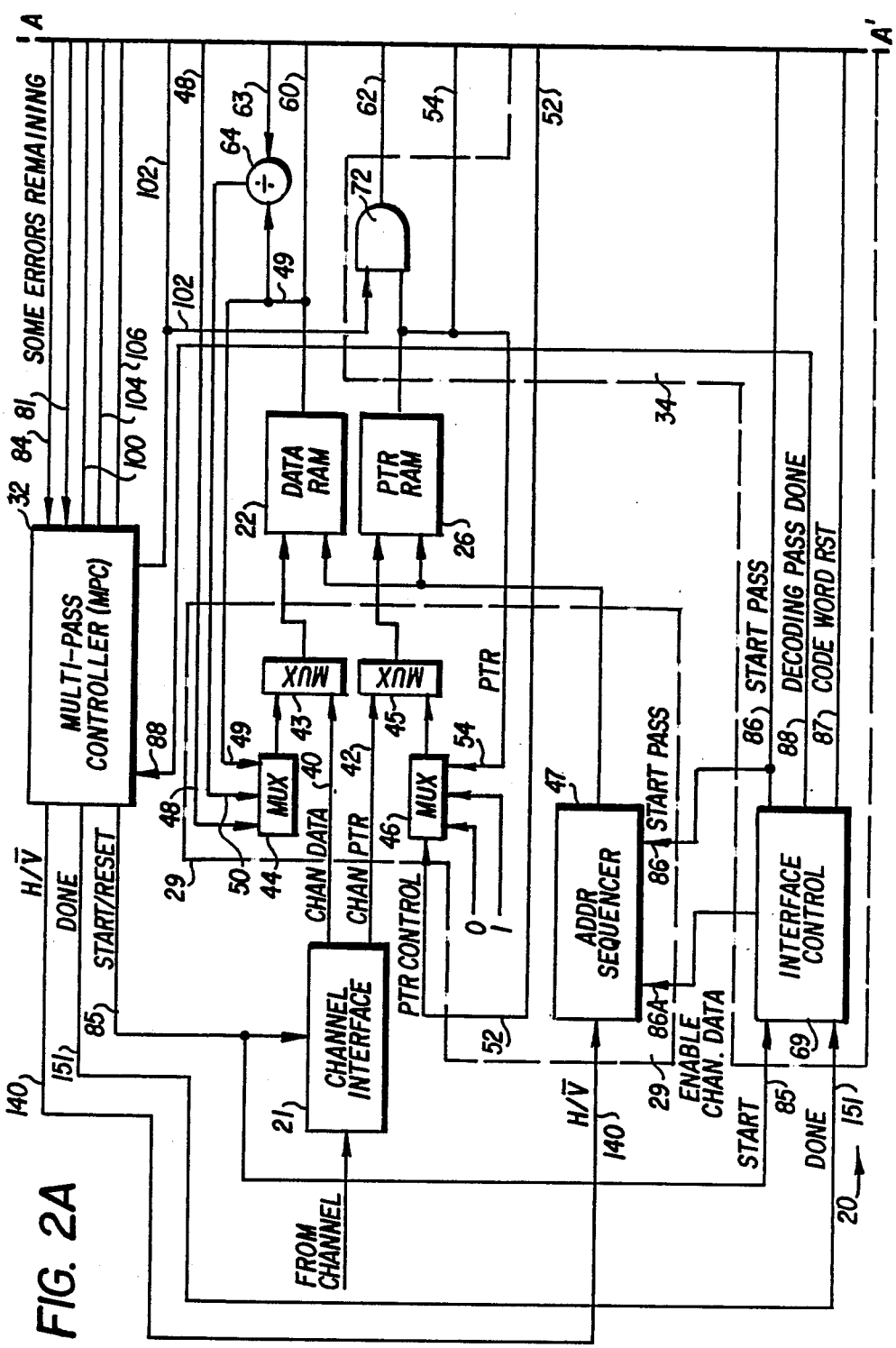
FIG. 2 is a schematic view of an error correction system according to an embodiment of the invention.
Figure 2B:
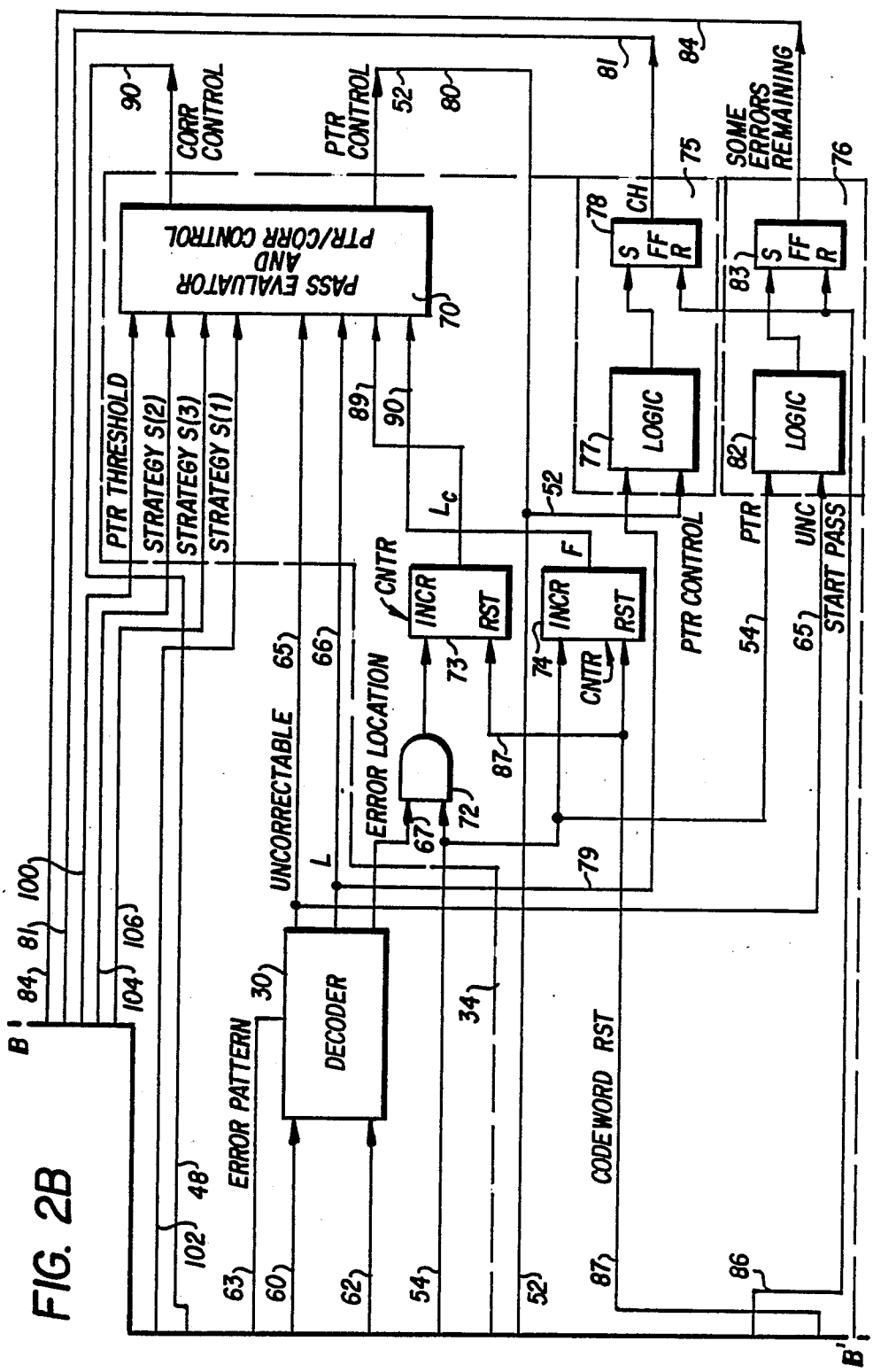

FIG. 2 shows an error correction system (ECS) 20 comprising a channel interface 21; a data random access memory (RAM) 22; a pointer random access memory (RAM) 26; RAM access control circuit (framed by broken line 29); a decoder 30; a multi-pass controller (MPC) 32; and, a controller/decoder interface circuit (CDIC) (framed by broken line 34).

The channel interface 21 receives coded information from the channel and transmits the coded information as channel data on channel data bus 40 to the data RAM via the RAM access control circuit 29. The transmitted coded information is of the type operated upon by product codes.

The channel interface 21 is of a conventional type which can detect erasures in the coded information and can apprise the decoder 30 of the occurrence of erasures in the coded information. In this regard, if the channel interface determines that an erasure has occurred in the coded information being transmitted on channel data bus 40, the channel interface 21 applies a TRUE signal on a channel pointer bus 42 which connects the channel processor and the pointer RAM via the RAM access control circuit 29.

Figure 1:
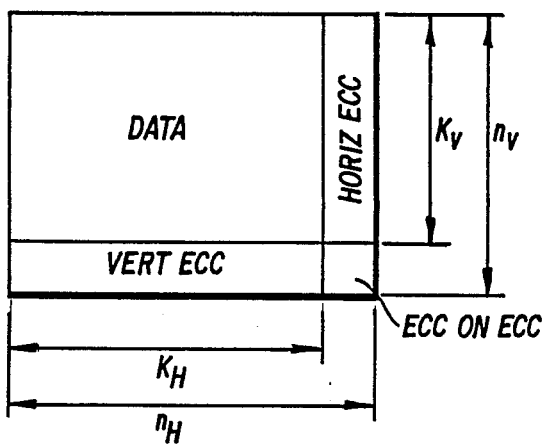
FIG. 1 is a schematic, diagrammatic view generally showing a two dimensional conceptualization of coded information operated on by product codes.

The data RAM 22 is capable of storing bytes of coded information in addressable locations. The data RAM 22 can be conceptualized as having a block of information stored therein in a matrix format with the matrix having rows and columns much in the manner of FIG. 1.

The pointer RAM 26 includes memory locations such that each bit in pointer RAM 26 corresponds to a byte in the data RAM 22. If a bit in pointer RAM 26 is set, then it is suspected that the contents of the corresponding data byte in data RAM 22 is erroneous.

The RAM access control circuit 29 includes data input selection multiplexer 43; data correction selector multiplexer 44; pointer input selector multiplexer 45; error pointer setting multiplexer 46; and, an address sequencer circuit 47. The data correction selector multiplexer 44 uses a control signal on line 48 to select between a first data input bus 49 or a second data input bus 50, and to apply the signal on the selected bus to one input port of the data input selector multiplexer 43. The other input port of the data input multiplexer 43 is connected to the channel data bus 40. The data input selector multiplexer 43 is connected to transmit to the data RAM 22 either the channel data on bus 40 or the data from multiplexer 44.

The error pointer setting multiplexer 46 uses a pointer control signal applied on line 52 to select between a TRUE ("1") input signal, a FALSE ("0") input signal, and a pointer feedback input signal applied on line 54. The multiplexer 46 applies the selected signal to one input pin of the pointer input selector multiplexer 45. The other input pin of the pointer input selector multiplexer 45 is connected to the channel pointer bus 42. The pointer input selector multiplexer 45 transmits to the pointer RAM 26 either the pointer value on bus 42 or the pointer from the multiplexer 46.

Figure 4:
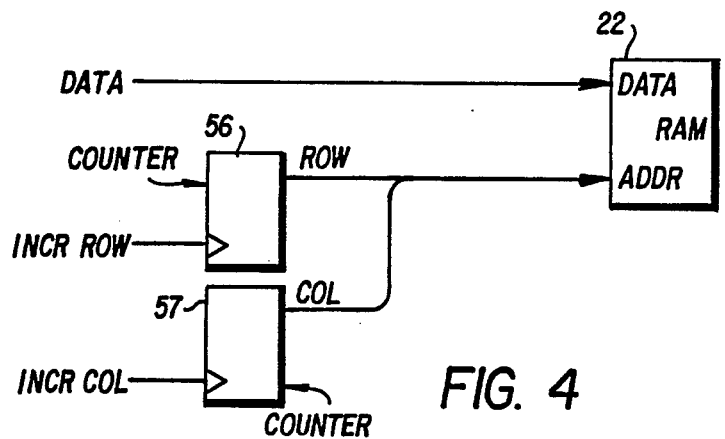
FIG. 4 is a schematic view of RAM addressing circuitry according to am embodiment of the invention.

FIG. 4 shows certain elements included in the address sequencer 47 for addressing the data RAM 22. Although unillustrated, similar elements exist in circuit 47 for addressing the pointer RAM 26. Each location in the RAMs 22 and 26 has an address which is the concatenation of high order address bits (which represent a row number) and low order address bits (which represent a column number). The higher order bits are obtained from a row counter 56 while the lower order bits are obtained from a column counter 57. When data is being accessed row-by-row (e.g., when data is being written by the channel and when performing a horizontal decoding pass) the column counter 57 increments with each byte and the row counter 56 increments when the end-of-row is reached, at which time the column counter 57 is reset. The opposite occurs when making a vertical pass (column-by-column). The concatenated addresses are applied to RAMS 22 and 26 on address bus 58.

As an example of the foregoing, assume that the matrix is 32 rows by 32 columns. The addresses for RAM 22 consist of 10 bits: 5 for address bits and 5 column address bits. In a horizontal pass the address sequence is: 0,1,2, ... 1023. In a vertical pass the sequence is: 0,32,64, ... 992,1,33,65, ... 993,2,34,66, 994, ... 31,63,95, ... 1023.

The coded information in the data RAM 22 is transmittable on decoder data input bus 60 to the decoder 30. Likewise, the pointer information in the pointer RAM 26 is transmittable on a decoder input pointer bus 62 to the decoder 30.

The decoder 30 is of a conventional type suitable for use in decoding Reed-Solomon codes. The decoder 30 is of a type that comprises means for generating syndromes for a codeword, means for using the syndromes and erasure locator pointers to obtain coefficients of an error/erasure polynominal for the codeword, means for conducting a search (e.g., a Chien search) for the roots of the error/erasure polynomial; and, means for generating a corrected error pattern for the codeword. Although the error correction system 20 of the present invention can employ any conventional decoder thusly characterized, decoder circuitry particularly suitable for use in conjunction with the present invention is that shown and described in concurrently-filed U.S. patent application Ser. No. 07/059,642 of Christopher Paul Zook entitled "Method and Apparatus for Detecting the Coefficients of a Locator Polynomial", which is incorporated herein by reference. Although the referenced circuitry operates in conjunction with one generator polynomial for a single pass, it is understood that two such circuits may be utilized—one circuit for utilizing a first code during a horizontal pass and a second circuit for utilizing a second code during a vertical pass.

The decoder 30 thus receives input on the decoder input data bus 60 and on the decoder input pointer bus 62. The decoder 30 transmits information on a decoder output data or "error pattern" bus 63 to an adder 64; on a line 65 which carries a TRUE signal if the decoder 30 determines that a codeword is uncorrectable; on a bus 66 that carries a value indicative of the number of errors in a codeword detected by the decoder 30 during a pass, the letter "L" being used to represent such number of errors; and, on line 67 which carries a TRUE signal if a symbol or byte was noted by the decoder 30 as being an error location.

The adder 64 has a first input port connected via bus 49 to the data output port of the data RAM 22 and a second input port connected via bus 63 to the error pattern output port of the decoder 30. The data output port of the adder 64 is connected by the bus 50 to the data correction selector multiplexer 44.

The controller/decoder interface circuit (CDIC) 34 includes an interface controller 69; a pass evaluator and pointer/correction controller 70; two AND gates 71 and 72; an "$L_c$" counter 73; an "F" counter 74; means for determining whether the decoder 30 has made a correction change to the block of information during the most recent pass (such means being framed by broken line 75); and, means for determining whether errors still remain in the block of coded information after the most recent pass (such means being framed by broken line 76).

The change determination means 75 for determining whether the decoder 30 has made a correction to the block of coded information in data RAM 22 during the most recent pass includes a logic circuit 77 and a flip-flop 78. The logic circuit 77 uses a signal indicative of the number of errors L detected during the most recent pass of the decoder 30 (such signal being applied on line 79) and a "pointer control" signal (applied on line 52) to determine whether the decoder 30 has made a correction, during the most recent decoding pass, to the coded information in data RAM 22. If it is determined that such a change has, in fact, been made, a TRUE signal is generated and latched out of flip-flop 78 for application on the "CH" (i.e. "change") line 81 to the MPC 32.

The means 76 for determining whether errors remain after the most recent pass of decoder 30 includes a logic circuit 82 and a flip flop 83. The logic circuit 82 monitors output signals from the pointer RAM 26 (on the pointer feedback line 54) and the "uncorrectable" signal (on line 65) to determine if any errors remain after the most recent pass of the decoder 30. If it is determined that such errors still remain, a TRUE signal is generated and latched out of flip flop 83 for application on line 84 to the MPC 32.

The interface controller 69 receives a TRUE signal on line 85 from the channel interface 21 when the channel interface 21 is ready to have the decoder 30 begin to operate upon coded information received from the channel. An output pin of the interface controller 69 is connected by a "start pass" line 86 to reset pins of the flip-flops 78 and 83 so that the flip-flops 78 and 83 are reset prior to the decoding of a block. Another output pin of the interface controller is connected by an "enable channel data" line 86A to the address sequencer circuit 47. Another output pin of the interface controller 69 is connected by a "CODEWORD RST" line 87 to reset pins of the $L_c$ counter 73 and the F counter 74 to reset those counters prior to the decoding of each codeword. Another output pin of the interface control 69 is connected by a "decoding pass-done" line 88 to the MPC 32.

The AND gate 71 included in the CDIC 34 has a first input pin connected to the output pin of the pointer RAM 26 and a second input pin connected via a "strategy S(1) enablement" line to the MPC 32. The output pin of AND gate 71 is connected by the decoder pointer input bus 62 to the decoder 30.

The AND gate 72 included in the CDIC 34 has a first input pin connected by line 54 to the output pin of the pointer RAM 26 and a second input pin connected to line 67 (which carries the "error location" signal from the decoder 30). The output pin of AND gate 72 is connected to the incrementation input pin of the $L_c$ counter 73. An $L_c$ data output bus 89 connects a data output port of the $L_c$ counter 73 to the pass evaluator and pointer/correction controller 70.

The F counter 74 has an incrementation input pin connected by line 54 to the output pin of pointer RAM 26 and a reset pin connected by line 87 to the "CODEWORD RST" pin of the interface controller 69. An F data output bus 90 connects a data output port of the F counter 74 to the pointer/correction controller 70.

The pass evaluator and pointer/correction controller 70 is connected by the afore-mentioned "uncorrectable" line 65 and "L" count line 66 to the decoder 30, and by the afore-mentioned $L_c$ data output bus 89 and the F data output bus 90 to the counters 73 and 74, respectively. In addition, the pointer/correction controller 70 receives input from the MPC 32 on the pointer threshold bus 100; on a strategy S(1) enablement line 102; on a strategy S(2) enablement line 104; and, on a strategy S(3) enablement line 106. The pointer control output line 52 connects a pointer output pin of the controller 70 to the logic circuit 77 and to a control pin of the error pointer setting multiplexer 46. A corrected pattern data control line 48 connects the controller 70 to a control pin of the data correction selector multiplexer 44.

A brief digression regarding the concept of "state" is in order prior to discussing the structure of the multi-pass controller (MPC) 32. As will become more apparent hereinafter, the MPC 32 employs an error correcting procedure wherein the MPC 32 selects from a plurality of error correcting strategies S(1), S(2), . . . S(N) and directs the decoder 30 to implement the selected strategy for attempting to correct errors located in the coded information. The strategies of a procedure are ranked and called in hierarchial order such that the order of strategy S(1) is greater than the order of strategy S(2), the order of strategy S(2) is greater than the order of strategy S(3), and so forth (i.e., S(1)>S(2)>S(3)> . . . >S(N)).

For a given decoder 30 each procedure includes a plurality of predetermined states. Each state has a state number. Each state has associated therewith a particular type of pass [for example, a horizontal pass ("H") or a vertical pass ("V")]; a particular one of the strategies; and, if the strategy is S(1), a particular pointer threshold ("PT") value.

Figure 3:
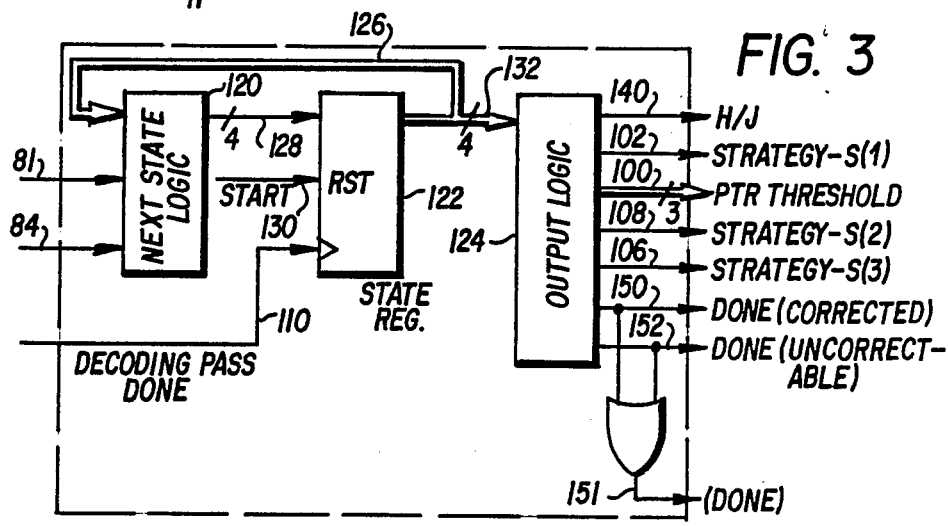
FIG. 3 is a schematic view of a multi-pass controller according to an embodiment of the invention.

As seen with reference to FIG. 3, the MPC 32 comprises three basic sections: a next state logic (NSL) section 120; a state register 122; and, an output logic (OL) section 124. The NSL section 120 is connected to lead 84 (which carries the "some error remaining" signal) and to lead 81 (which carries the change of data signal or data corrected signal). The NSL section 120 also has input ports connected by a state feedback loop 126 to a current state output port of the state register 122. The NSL section 120 uses inputs received on lines 81 and 84 as well as a current state signal carried on the state feedback loop 126 to consult an internally-stored look-up table to determine what the next state of the procedure should be, and to generate a signal indicative of that state number on a next state bus 128 for application to data input ports of the state register 122.

The state register 122 is connected not only to the NSL section 120, but also by the start/reset line 85 to the channel interface 21 and by the lead 88 (which carries the decoding pass done signal) to the interface controller 69. The state register 122 has its current state output port connected to a current state bus 132. The bus 132 is also connected to a data input port of the OL section 124.

The output logic (OL) section 124, knowing the state number as applied thereto on bus 132, uses the current state number to generate a plurality of signals which are applied to the CDIC 34. More particularly, the OL section 124 generates signals for the following leads: a pass direction lead 140; the strategy S(1) enablement lead 102; the pointer threshold (PT) bus 100; the strategy S(2) enablement lead 104; the strategy S(3) enablement lead 106; a "corrected" status lead 150; and, an "uncorrectable" status lead 152.

The OL section 124 employs a look-up routine on a pre-programmed table to determine, for a given state number, what values are to be applied to each of its output leads. For example, for a certain state number the OL section 124 will know whether to apply a TRUE signal on lead 140 indicative of a horizontal pass; whether to apply a TRUE signal of lead 102 if strategy S(1) is to be implemented, and so forth.

OPERATION: PROCEDURE

The operation of the ECS 20 of FIG. 2 will now be discussed with reference to a multi-pass procedure that operates on a Reed Solomon codeword having n number of characters, including K information characters, such that the number of check characters is n-K=4. The procedure includes three strategies, namely strategies S(1), S(2), and S(3), with the hierarchial order being S(1)>S(2)>S(3). Thus, strategy S(1) is initially employed and, as such, takes into consideration the erasure pointers developed by the channel interface 21.

Figure 5:
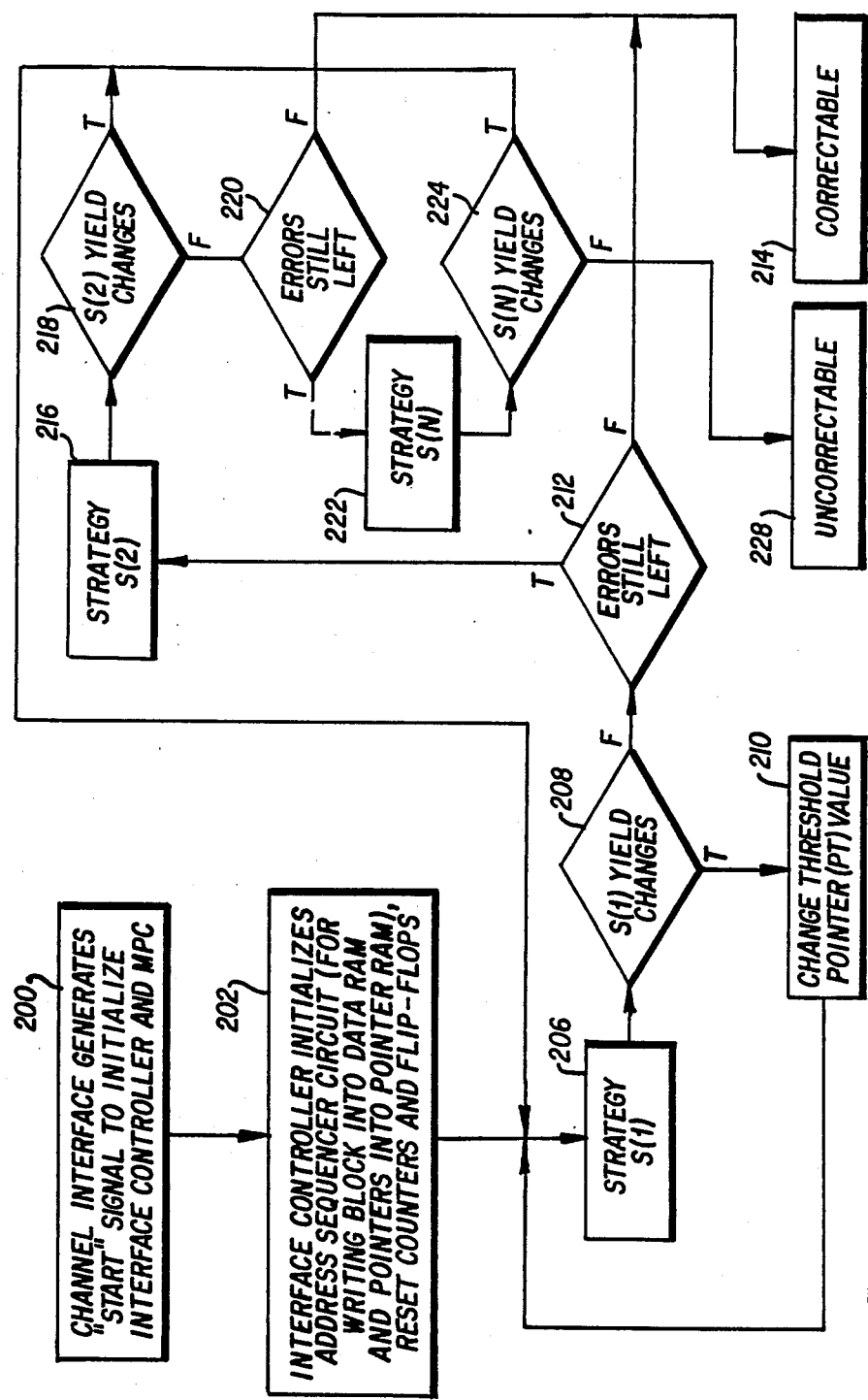
FIG. 5 is a schematic, diagrammatic view of an error correction procedure employing error correction strategies S(1), S(2), . . . S(N)

FIG. 5 shows a generic multi-pass procedure employing steps 200 through 228 for implementing strategies S(1), S(2), . . . S(N). For the example under discussion, S(N)=S(3) and accordingly symbols 206, 216, and 222 represent strategies S(1), S(2), and S(3), respectively.

The strategies S(1), S(2), . . . S(N) are customized for each decoder and, if necessary, for each application. Illustrative steps involved in strategies S(1), S(2), and S(3) are provided herewith with reference to the descriptions of FIGS. 6, 7, and 8, respectively.

At step 200 of FIG. 5, the channel interface 21 generates a start/reset signal on line 85 for resetting the MPC 32 and for starting the interface controller 69. The reset signal on line 85 in particular resets the state register 122 in the MPC 32.

At step 202 the interface controller 69 uses the start signal on line 85 to initialize the address sequencer circuit 47; to reset the flip-flops 78 and 83 (by applying a signal on line 86); to reset the counters 73 and 74 (by applying a signal on line 87); and, to commence writing channel data and pointer information into the data RAM 22 and into the pointer RAM 26.

With regard to the writing into RAMs 22 and 26, at step 202 the interface controller 69 initializes the address sequencer circuit 47 by applying a TRUE signal on line 86A. The address sequencer circuit 47 further uses the "start pass" signal applied on lead 86 to generate the concatenated addresses in the aforedescribed manner for specifying the memory locations into which data is to be written in the data RAM 22 and the pointer RAM 26. During the writing process the multiplexer 43 is controlled so that channel data on bus 40 is written into the data RAM 22 at memory locations specified by the address sequencer circuit 47. Likewise, the multiplexer 45 is controlled so that erasure pointers on bus 42 are written into or "set" in the pointer RAM 26 at memory locations specified by the address sequencer circuit 47. The number of erasure pointers so set for a given codeword prior to a decoding pass of the decoder 30 shall be denoted by the letter "F".

When reset, the state register 122 of the MPC 32 generates a state value equal to zero, and applies that state value on the current state bus 132 and on the current state feedback loop 126 to the OL section 124 and to the NSL section 120, respectively. The abbreviation "SV" is hereinafter used to represent state value and, when followed with a "=" sign, indicates a particular state value number.

Symbol 206 of FIG. 5 reflects the selection of strategy S(1). Strategy S(1) is always selected by MPC 32 when SV=0. Since strategy S(1) is selected, a TRUE signal is applied on strategy S(1) enablement lead 102 and FALSE signals are applied on leads 104 and 106. In accordance with the customized structuring of strategy S(1), predetermined values are also applied on the pointer threshold (PT) lead 100 for use by the decoder 30 in implementing strategy S(1).

OPERATION: STRATEGY S(1)

Reference is now made to FIG. 6 wherein steps involved in the execution of strategy S(1) are illustrated. After commencement of strategy S(1) at step 250, strategy S(1) causes the decoder 30 to conduct a decoding pass (step 252) to locate errors. The value of the signal applied on the pass direction lead 140 determines whether the pass is a horizontal pass (if a TRUE signal) or a vertical pass (if a FALSE signal). The decoder 30 attempts to locate errors using the appropriate code in accordance with the mandated pass direction.

In conducting a decoding pass in accordance with strategy S(1), the decoder 30 utilizes the pointers set in the pointer RAM 26. As mentioned before, the numbers of such pointers previously set for a codeword in the pointer RAM 26 shall be represented by the letter "F". During the first such pass when the state value is zero (SV=0), the pointers in the pointer RAM 26 will be the erasure pointers generated by the channel interface 21. During subsequent passes in accordance with strategy S(1) the pointers in pointer RAM 26 may have been set as a result of error location during a previous pass of the decoder 30. In any event, when strategy S(1) is implemented the decoder 30 can receive the pointers from pointer RAM 26 inasmuch as the TRUE signal on the strategy S(1) enablement lead 102 permits the pointers to be gated through AND gate 71 and into the decoder 30. Pointers are not used in the implementation of the other two strategies (S(2) and S(3)) described herein.

During the decoding pass of step 252 the decoder 30 attempts to locate errors using the appropriate code for the mandated pass direction. As an error is located for a codeword, the decoder 30 applies a TRUE signal on the error location line 67 for application to the CDIC 34, and particularly to the AND gate 72 which feeds the "$L_c$" counter 73. When a byte with an error is located, the decoder generates an error pattern on bus 63 for application to the adder 64. After a codeword is decoded, the decoder 30 applies a value on line 66 indicative of the number of errors "L" located in the codeword during the current pass.

After a codeword has been decoded and errors therein located, at steps 254 through 256 the effectiveness of the pass for the codeword is evaluated by the pass evaluator and correction/pointer controller 70. The evaluation commences at step 254 by the computation of a miscorrection probability index (MPI). At step 256 the MPI is compared with the pointer threshold (PT) value.

The expression for the miscorrection probability index (MPI) is: MPI=3L-F, where L and F are used consistently with the above-attributed definitions, i.e., F is the number of pointers that exist in pointer RAM 26 prior to a decoding pass and L is the number of errors located by the decoder during the most recent pass. The pass evaluator 70 uses conventional circuit elements to evaluate the MPI expression. In this regard, the pass evaluator 70 receives the value of L on bus 66 from the decoder 30. The value of F is obtained from the F counter 74 which, as mentioned before, has its incrementation input pin connected to the output of the pointer RAM 26.

The greater the value of the MPI, the greater is the probability of a miscorrection. For a codeword with 4 check characters, the value of the MPI will range between 0 and 8. A derivation of the MPI is provided hereinafter.

As an aside, prior to evaluating the decoder pass, the pass evaluator 70 makes a precautionary check to determine whether F>4 and whether the decoder 30 has labeled the codeword as "uncorrectable." In the latter regard, if the decoder 30 determines that the syndromes of a codeword do not correspond to a correctable error pattern, the decoder 30 generates an "uncorrectable" signal on line 65.

At step 256 the pass evaluator 70 compares the value of the MPI, computed in the above-described manner by the pass evaluator 70, with the pointer threshold (PT) value applied to the pass evaluator 70 by MPC 32 on bus 100. The pass evaluator makes this comparison by simple data comparator circuitry provided therein. If the pass evaluator 70 determines for a codeword that the value of the MPI is not greater than the value of the PT, then the pass evaluator 70 resets (i.e. clears) the pointers generated by the decoder 30 during the most recent decoder pass. The usage of the error pattern generated by decoder 30 and resetting of the pointers are permitted inasmuch as, for strategy S(1), the pass evaluator and pointer/correction controller 70 generates TRUE signals on both lines 48 and 52 if the value of MPI is not greater than the value of the pointer threshold (PT). In this regard, a TRUE signal on line 48 requires the data correction selector multiplexer 44 to select corrected data on bus 50 from adder 64 for loading back into the data RAM 22. A TRUE signal on line 52 requires the error pointer setting multiplexer 46 to ultimately apply a reset ("0") value to all pointer locations in the pointer RAM 26 for the current codeword. If the pass evaluator 70 determines that the value of MPI is greater than the PT value, then all pointers for the codeword would be set although the generated error pattern would be utilized.

At step 260 a test is made to determine if all codewords (in the same direction) have been decoded. If not, then steps 252 through 258 are repeated for the next codeword.

The multi-pass procedure requires the MPC 32 to check (at step 208 of FIG. 5) whether the execution of strategy S(1) involved any changes to the block of information in data RAM 22 during the pass. This check is performed by the change determination means 75. The change determination means 75 receives the value of L on bus 79 and is also connected to the pointer control line 52, permitting the logic circuit 77 included therein to compare the number and location of the pointers existing prior to the decoding pass for the block with the number and location of pointers existing after the decoding pass for the block. If a change were made to any codeword in the block during the pass, a TRUE signal is applied on lead 81 to the NLS section 120 of the MPC 32. Knowing the current state number (applied on feedback loop 126) and the signal applied on lead 81, the NLS section 120 consults its internally stored, pre-programmed table to determine what state is next to be chosen and applies the next selected state number on bus 128 to the state register 122.

Upon completion of an execution of strategy S(1), a TRUE signal is applied on lead 88 to the state register 122. Upon receipt of this TRUE signal, the state register 122 latches the next selected state value number on to buses 126 and 132, so that the next selected state value becomes the current state value.

The OL section 124 of the MPC 32 uses the new current state value to determine what values should be applied to the leads 140, 102, 104, 106 and bus 100. If the new current state value was chosen by the NSL section 120 because there was, during the last pass of the decoder 30, a change in the coded information in the data RAM 22, then, if the last pass was executed in accordance with strategy S(1), the OL section 124 will require that strategy S(1) be again executed, but for a pass in a different direction and with a different pointer threshold value, preferably a greater pointer threshold value. For example, if the first execution of strategy S(1) involved a pass in the horizontal direction, for a second execution of strategy S(1) the MPC will apply a FALSE signal on lead 140 to indicate that a vertical pass will next occur.

With regard to a different pointer threshold (PT) value, at step 210 of FIG. 5 the OL section 124 of the MPC 32 increases the value of PT. Thus, if during the first execution of strategy S(1) the value of PT was PT(1), and during successive executions of strategy S(1) the values of PT are PT(2),PT(3), ... PT(N), then the PT values should be chosen such that PT(1)<PT(2)<PT(3)< ... <PT(N). The designer of the MPC 32 can select values for the PT in accordance with the particular correction application. As mentioned before, the OL section 124 of the MPC 32 applies the PT value on bus 100.

If, after any further execution of strategy S(1), it is determined at step 208 that no changes were made to the contents of the data RAM 22 or to the contents of the pointer RAM 26, then at step 212 the procedure requires that the CDIC 34 to determine whether any errors still remain in the block of coded information in the data RAM 22. If no errors remain, then the corrected codeword is latched onto a bus for application to an unillustrated utilization device.

The determination at step 212 as to whether any errors yet remain is conducted by the remaining error determination means 76 of the CDIC 34. The logic circuit 82 of the determination means 76 is connected to the "uncorrectable" line 65 and via line 54 to the output of the pointer RAM 26. Thus, logic circuit 76 knows whether pointers still exist in the pointer RAM 26, and hence whether any errors remain in the block of coded information stored in the data RAM 22.

After the MPC 32 is finished supervising the multi-pass decoding procedure for a codeword, as occurs when no errors remain in the codeword (indicated by a FALSE signal on line 84), the MPC 32 applies a TRUE signal via the "done" line 151 to the interface controller 69. The interface controller 69 thus knows to prepare itself for the receipt of a new start signal on line 85 and for the attendant hereinbefore described initializaton steps executed by the interface controller 69.

If the determination at step 212 reveals that pointer values still exist in the pointer RAM 26, the signal on line 84 goes FALSE and the NSL section 120 of the MPC 32 knows to select a state that requires implementation of another strategy, particularly the next-highest order strategy. In the current example, therefore, the NSL section 120 would chose a state that requires implementation of strategy S(2).

OPERATION: STRATEGY S(2)

If the NSL section 120 of the MPC 32 were to select a next state number that the OL section 124 associates with strategy S(2), the the OL section 124 would apply a TRUE signal on lead 104 (the strategy S(2) enablement lead and FALSE signals on leads 102 and 106. The PT bus 100 is not utilized in the example under discussion for any strategies other than strategy S(1). The execution steps of strategy S(2) are illustrated with reference to FIG. 7.

In implementing strategy S(2) the decoder 30 conducts a decoding pass (step 270). The decoding pass for strategy S(2) differs from the pass of strategy S(1) in that input pointers, although perhaps existing, are not utilized (since the signal on lead 102 is FALSE, and the output of AND gate 71 is FALSE).

At step 272 in the implementation of strategy S(2), the CDIC 34 determines a value $L_c$, wherein $L_c$ is defined as the number of errors detected by the decoder during the decoding pass of step 270 which already had, pointers in RAM 26 associated therewith prior to the decoding pass. The number for $L_c$ is determined by the $L_c$ counter 73 which receives the logical ANDing (via gate 72) of the error location signal (one line 67) generated by the decoder 30 and the output (on line 54) of the pointer RAM 26.

At step 274 the pass evaluator 70 conducts an evaluation of the implementation of strategy S(2) for this most recent decoder pass. The pass evaluator uses the value of $L_c$ (communicated on bus 89); the value of L (communicated on bus 66); the value on the "uncorrectable" line 65; and, the value of F (communicated on bus 90) in the course of the evaluation.

For strategy S(2) the pass evaluator 70 permits the decoder 30 to make its proposed corrections to the data in the data RAM 22 (by applying a TRUE signal on line 48) and will clear all pointer values stored in the pointer RAM 26 for the current codeword if either of the following two cases occur (assuming that the decoder 30 determines that the codeword is not uncorrectable):

CASE (1): $L \leq 1$
CASE (2): $L=2$, $F \leq 4$, and $L_c=2$.

For strategy S(2) the pass evaluator 70 will not permit the decoder 30 to make its proposed corrections (i.e., will set line 48 FALSE) but will set all the existing error pointers if either of the following three cases occur:

CASE (3): $L=2$, $F \leq 3$, $L_c=1$ and the decoder 30 determines that the codeword is not uncorrectable.
CASE (4): $L=2$, $F \leq 2$, $L_c=0$ and the decoder 30 determines that the codeword is not uncorrectable.
CASE (5): $F \leq 2$ and the decoder 30 determines that the codeword is uncorrectable.

For the strategy S(2) the pass evaluator 70 will not permit the decoder 30 to make its attempted corrections (i.e., will make line 48 FALSE) and will not allow the contents of the pointer RAM 26 to be changed if any of the following cases are true:

CASE (6): $L=2$, $F=4$, and $L_c=1$.
CASE (7): $L=2$, $F=3$, and $L_c=0$.
CASE (8): $F>4$.
CASE (9): $F>2$ and the decoder 30 determines that the codeword is uncorrectable.

Upon completion of strategy S(2), the multipass procedure determines at step 218 whether any changes were made in the contents of the data RAM 22 in like manner as hereinbefore described with respect to step 208. If the result of the determination at step 218 is affirmative, then procedural execution branches back to step 206 whereat strategy S(1) is again implemented. During such a next implementation, strategy S(1) will operate upon the contents of data RAM 22 and the pointer RAM 26 as modified by strategy S(2). If the determination at step 218 is negative, a determination is made at step 220 whether any errors still exist. This determination is essentially the same as the determination earlier described with respect to step 212. If no such errors still exist, the corrected block is latched into the utilization device. If pointer values are still extant, strategy S(3) is implemented as described below.

OPERATION: STRATEGY S(3)

The execution of strategy S(3) is understood with reference to FIG. 8. Strategy S(3) is basically the same as strategy S(2), except that the codeword is corrected and pointers are unchanged in the pointer RAM 26 if the following additional case occurs:

CASE (10): $L=2$, $F>4$, and $L_c=2$.

After execution of strategy S(3), a determination is made at step 224 whether changes were made with respect to the contents of the data RAM 22. If changes were made with respect to the contents of the data RAM 22, the strategy S(1) is again implemented, this time using the contents of the data RAM 22 and the pointer RAM 26 as modified by the implementation of strategy S(3). If the execution of strategy S(3) left the data RAM 22 and the pointer RAM 26 unchanged, the block is presumed to be uncorrectable (step 228).

EXAMPLE

Figure 9:
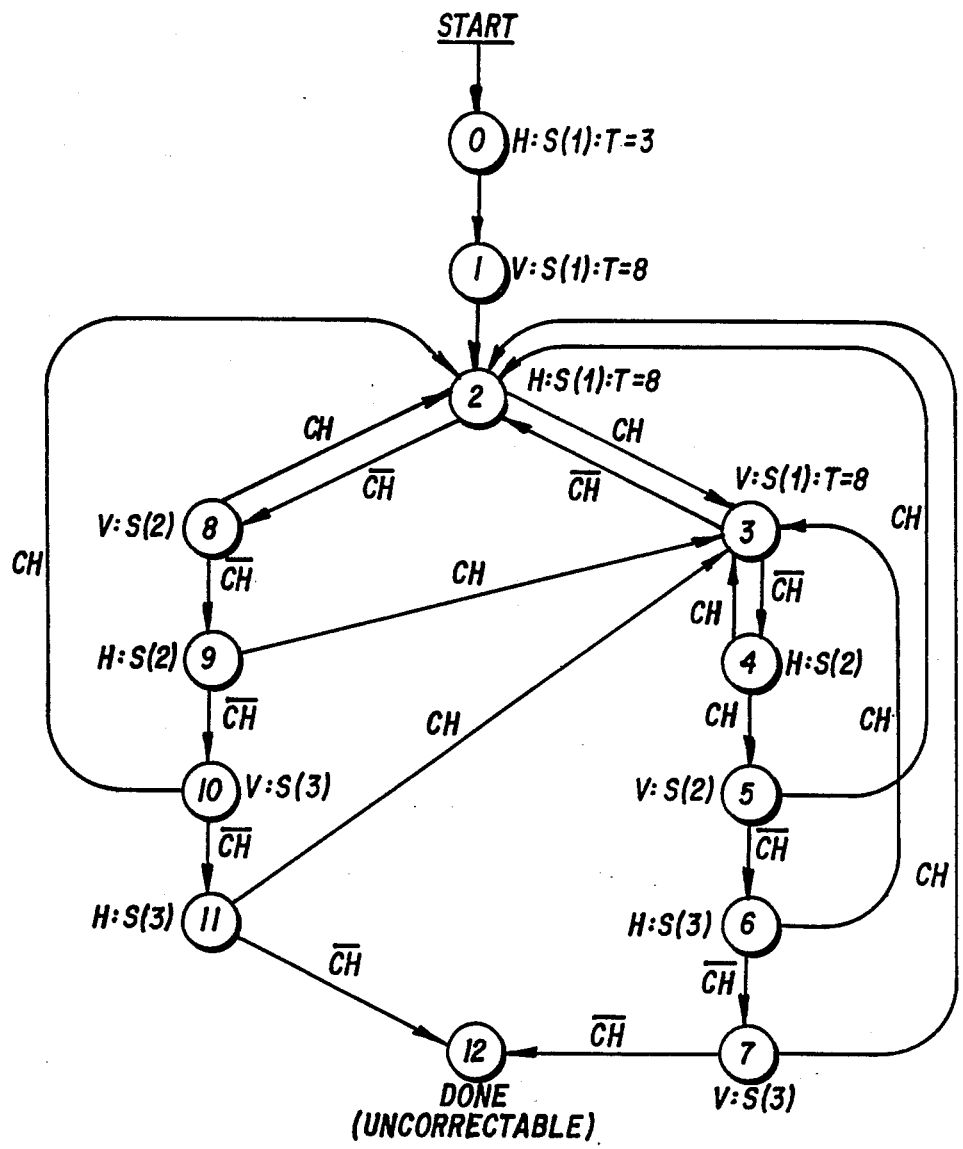

FIG. 9 illustrates an example procedure employing the strategies S(1), S(2), and S(3) described above. Each circle symbol in FIG. 9 represents a state selectable by the NSL section 120 of the MPC 32, with the state number being circumscribed by its associated symbol. Associated with each state is a set of parameters having the format:

$$D:S(X):T=Y$$

where D is the direction for the pass ("H" or horizontal; "V" for vertical); where S(X) is the strategy to be implemented for the pass, where X ranges from 1 to 3; and, where Y is the value of the pointer threshold (PT) [for states involving strategy S(1) only).

In FIG. 9, the notation CH is associated with arrows pointing toward a next selected state value if line 81 (the "CH" line indicating a change in the contents of the data RAM 22) is TRUE. The notation $\overline{CH}$ is associated with arrows pointing toward a next selected state value if line 81 is FALSE. Thus, FIG. 9 provides an example of how the NSL 120 of the MPC 32 uses the current state value and the value on line 81 to determine the next state value. FIG. 9 further illustrates values which the OL section 124 of the MPC 32 can preset for a given new current state value.

In the above regard, at SV=0 the OL section 124 directs that a horizontal pass using strategy S(1) be implemented, and that during that implementation PT=3. A second implementation of strategy S(1) will always follow for the next state value, i.e., SV=1, but using a vertical pass and a greater value for PT (PT=8). Likewise, state SV=2 requires a third implementation of strategy S(1). Knowing then that SV=2, and knowing whether CH is TRUE or FALSE, the NSL section 120 can determine whether to chose SV=3 or SV=8.

DERIVATION OF MPI

The expression for the miscorrection probability index (MPI) is derived in the following manner. Recall that F is the number of pointers input into the decoder 30 (where $F \leq 4$) and that L is the number of errors detected by the decoder 30 after being initialized with the pointers. Thus $L \geq F$. The quantity L-F is the number of errors detected by the decoder that did not have a pointer prior to detection. In order to correct a vector, one byte of redundancy is needed for each erasure and two bytes of redundancy are needed for each error. Therefore, F+2(L-F) is the amount of redundancy used. The more redundancy used for error correction, the less redundancy is left for detection and hence the higher the probability of miscorrection. Thus, the quantity F+2(L-F) is utilized in the derivation.

Let $e_1, e_2, \ldots e_L, \ldots$ be the L error locations calculated by the decoder 30.

$$\text{Let } \sigma(\chi) = (\chi + \alpha^{e_1})(\chi + \alpha^{e_2}) \ldots (\chi + \alpha^{e_L})$$

where $\alpha$ alpha is a primitive root of the Galois field from which the codewords are constructed. Multiplying $$\sigma(\chi) = \sigma_0 \chi^{L} + \sigma_1 \chi^{L-1} + \ldots + \sigma_{L-1}\chi + \sigma_L$$

where $$\sigma_0 = 1$$

it is well known that the following 4-L equations hold:

$$\sum_{i=0}^{L} \sigma_i S_{K+L-i} = 0, K = 1, 2, \ldots 4-L$$

where $S_l$ are the error syndromes.

Therefore, for an uncorrectable error not to be detected as uncorrectable, its syndromes must comply with the above 4-L equations. Therefore, the larger L is, the fewer the number of equations that the syndromes must satisfy and hence the higher the probability of miscorrection. The MPI is thus the sum of $F+2(L-F)$ and L. Therefore, $MPI=F+2(L-F)=3L-F$.

While the invention has been particularly shown and described with reference to the preferred embodiments thereof, it will be understood by those skilled in the art that various alterations in form and detail may be made therein without departing from the spirit and scope of the invention.

The embodiments of the invention in which an exclusive property or privilege is claimed are defined as follows:

1. A method of decoding coded information received from a channel and loaded into a data memory, said data memory being conceptualizable as having a matrix format with at least a first direction and a second direction, said information being loaded into said memory in a manner whereby locations in said memory conceptualized as being aligned in a first direction are presumable as being operable thereon by a first code, and in a manner whereby locations in said memory conceptualized as being aligned in said second direction are presumable as being operable thereon by a second code; said method comprising the steps of:
   (a) locating potential errors in said coded information loaded into said data memory by using at least one of said codes to attempt to decode memory locations upon which said code is presumed to operate;
   (b) generating error pointers which point to locations in said data memory whereat, as a result of said potential error location, errors are suspected as having occured;
   (c) attempting to correct, in accordance with one of said coded, memory locations whereat said generated pointers indicate that errors are suspected as having occurred;
   (d) generating a miscorrection probability index (MPI) having a value indicative of the probability that said attempted correction is an accurate correction;
   (e) using said miscorrection probability index (MPI) to determine whether said generated error pointers should remain set and, if such determination is negative, clearing such error pointers; and,
   (f) determining whether the usage of at least one of said codes resulted in the attempted correction of any suspected errors and, if such determination is affirmative, repeating steps (a) through (f).

2. The method of claim 1, further comprising the step of:
   setting error pointers which point to locations in said data memory at which erasures are known to exist in said codewords.

3. The method of claim 1, wherein said step (e) of using said miscorrection probability index (MPI) to determine whether existing pointers should remain set in memory includes the steps of:
   generating a pointer threshold (PT) having a predetermined value; and,
   comparing the value of MPI and PT to determine whether said generated error pointers should remain set and, if such determination is negative, clearing such error pointers.

4. The method of claim 3, wherein in conjunction with step (f), the value of said pointer threshold (PT) is changed if the determination of step (f) is affirmative.

5. The method of claim 1, wherein F is the number of error pointers existing prior to the attempted location of potential errors by utilization of at least one of said codes; wherein L is the number of potential errors located after at least one of said codes is utilized to attempt to decode said memory locations upon which said selected code is presumed to operate; and wherein the miscorrection probability index (MPI) is determined using the factors L and F.

6. The method of claim 5, wherein the miscorrection probability index (MPI) is defined as $MPI=3L-F$.

7. The method of claim 1, wherein said first code is utilized for the first execution of steps (a) through (e), and wherein a second code is utilized for a second execution of steps (a) through (e).

8. The method of claim 1, wherein a miscorrection probability index (MPI) is generated for each codeword in said data memory.

9. A method of decoding coded information received from a channel and loaded into a data memory, said data memory being conceptualizable as having a matrix format with at least a first direction and a second direction, said information being loaded into said memory in a manner whereby locations in said memory conceptualized as being aligned in a first direction are presumable as being operable thereon by a first code, and in a manner whereby locations in said memory conceptualized as being aligned in said second direction are presumable as being operable thereon by a second code; said method comprising the steps of:
   (a) providing a plurality of strategies $S(1), S(2), \ldots S(N)$ for attempting to correct errors located in said coded information and establishing a hierarchial order for said strategies whereby the order of $S(1)>S(2)> \ldots >S(N(N)$;
   (b) selecting the highest order stragegy $S(1)$;
   (c) locating potential errors in said coded information loaded into said data memory by using at least one of said codes;
   (d) generating error pointers which point to locations in said data memory whereat errors are suspected as having occurred;
   (e) attempting to correct, in accordance with the implementation of said selected strategy, errors suspected as having occured in said coded information, said selected strategy being utilized to determine which pointers should be cleared after said attempted correction and which pointers should remain set;
   (f) determining whether the implementation of said selected strategy resulted in any attempted corrections to said coded information in said data memory and, if such determination is affirmative and the selected strategy is any strategy other than the highest order strategy, repeating steps (c) through (f);
   (g) determining whether any error pointers remain set after the implementation of said selected strategy and, if such determination is affirmative, selecting a next lower order strategy; and,
   (h) repeating at least steps (c) through (f) using said next highest order strategy as said selected strategy 10. The method of claim 9, wherein said attempt to correct errors in accordance with said highest order strategy $S(1)$ comprises the steps of:

(i) locating potential errors in said coded information loaded into said data memory by using at least one of said codes to attempt to decode memory locations upon which said code is presumed to operate;

(ii) generating error pointers which point to locations in said data memory whereat, as a result of said error location, errors are suspected as having occurred;

(iii) attempting to correct, in accordance with at least one of said codes, memory locations whereat said generated pointers indicate that errors are suspected as having occurred;

(iv) generating a miscorrection probability index (MPI) having a value indicative of the probability that said attempted correction is an accurate correction;

(v) using said miscorrection probability index (MPI) to determine whether said generated pointers should remain set and, if such determination is negative, clearing such pointers; and, (vi) determining whether the usage of at least one code resulted in the attempted correction of any suspected errors and, if such determination is positive, repeating steps (i) through (vi).

11. The method of claim 10, further comprising the step of:
setting error pointers which point to locations in said data memory at which erasures are known to exist in said codewords.

12. The method of claim 10, wherein said step (v) of using said miscorrection probability index (MPI) to determine whether existing error pointers should remain set in memory includes the steps of:
generating a pointer threshold (PT) having a predetermined value; and,
comparing the value of MPI and PT to determine whether said generated error pointers should remain set and, if such determination is negative, clearing such error pointers.

13. The method of claim 12, wherein in conjunction with step (vi), the value of said pointer threshold (PT) is changed if the determination of step (vi) is affirmative.

14. The method of claim 10, wherein F is the number of error pointers existing prior to the attempted location of potential errors by utilization of at least one of said codes; wherein L is the number of potential errors located after at least one of said codes is utilized to attempt to decode said memory locations upon which said selected code is presumed to operate; and wherein the miscorrection probability index (MPI) is determined using the factors L and F.

15. The method of claim 14, wherein the miscorrection probability index (MPI) is defined as $MPI = 3L - F$.

16. The method of claim 10, wherein said first code is utilized for the first execution of steps (i) through (vi), and wherein a second code is utilized for a second execution of steps (i) through (vi).

17. The method of claim 10, wherein a miscorrection probability index (MPI) is generated for each codeword in said data memory.

18. An apparatus for decoding coded information received from a channel and loaded into a data memory, said data memory being suitable for storing said received coded information and subsequently corrected versions of said coded information, said data memory being conceptualizable as having a matrix format with at least a first direction and a second direction, said coded information being loadable into said memory in a manner whereby locations in said memory conceptualized as being aligned in a first direction are operable thereon by a first code and in a manner whereby locations in said memory aligned in said second direction are operable thereon by a second code, said apparatus comprising:

a pointer memory suitable for at least temporarily storing error pointer values corresponding to locations in said data memory whereat errors are suspected;

a decoder for locating potential errors in said coded information loaded into said data memory by using at least one of said codes; for generating error pointer signals which correspond to locations in said data memory whereat errors are suspected as having occured; for attempting to correct, in accordance with the implementation of a selected strategy, errors suspected as having occured in said coded information;

evaluating means responsive to said selected strategy being utilized to determine whether said generated error pointers should be set in said point memory; and, control means for selecting one of a plurality of strategies $S(1), S(2), \ldots S(N)$, for attempting to correct errors located in said coded information, said strategies having a hierarchical order whereby the order of $S(1) > S(2) > \ldots > S(N)$; for directing said decoder to execute said selected stragegy; and for determining, after the implementation of said selected strategy, what further strategy said decoder is to implement.

19. The apparatus of claim 18, further comprising:
means for setting error pointers in said pointer memory which point to locations in said data memory at which erasures are known to exist in said codewords.

20. The apparatus of claim 18, wherein said evaluating means further comprises:
means for generating a miscorrection probability index (MPI) having a value indicative of the probability that said attempted correction is an accurate correction; and,
means for using said miscorrection probability index for determining whether said generated error pointers should be set and, if such determination is negative, clearing such pointers.

21. The apparatus of claim 20, wherein said means for using said miscorrection probability index (MPI) to determine whether said generated pointers should remain set in said pointer memory includes:
generating a pointer threshold (PT) having a predetermined value; and,
means for comparing the value of MPI and PT to determine whether existing error pointers should remain set and, if such determination is negative, clearing such error pointers.

22. The apparatus of claim 21, wherein the value of said pointer threshold (PT) is changeable.

23. The apparatus of claim 20, wherein F is the number of error pointers existing prior to the attempted location of potential errors by utilization of at least one of said codes; wherein L is the number of potential errors located after at least one of said codes is utilized to attempt to decode said memory locations upon which said selected code is presumed to operate; and wherein the miscorrection probability index (MPI) is determined using the factors L and F.

24. The apparatus of claim 23, wherein the miscorrection probability index (MPI) is defined as MPI = 3L - F.

25. The apparatus of claim 20, wherein said evaluating means uses a value $L_c$ to determine whether said generated error pointers should be set, wherein $L_c$ is the number of located errors which were pointed to, prior to said error location, by existing error pointers.

26. The apparatus of claim 20, wherein said evaluating means uses a value F to determine whether said generated error pointers should be set, wherein F is the number of errors pointed to prior to said error location.

27. The apparatus of claim 18, wherein said data memory is a random access memory.

28. The apparatus of claim 18, wherein said pointer memory is a random access memory.

29. An apparatus for decoding coded information received from a channel and loaded into a data memory, said data memory being suitable for storing said received coded information and subsequently corrected versions of said coded information, said data memory being conceptualizable as having a matrix format with at least a first direction and a second direction, said coded information being loadable into said memory in a manner whereby locations in said memory conceptualized as being aligned in a first direction are operable thereon by a first code and in a manner whereby locations in said memory aligned in said second direction are operable thereon by a second code; said apparatus comprising:

a pointer memory suitable for at least temporarily storing error pointer values which point to locations in said data memory whereat errors are suspected;

means for location potential errors in said coded information loaded into said data memory by using at least one of said codes to attempt to decode memory locations upon which said code is presumed to operate;

means for setting error pointers in error pointer memory which point to locations in said data memory whereat, as a result of said potential error location, errors are suspected as having occurred;

means for attempting to correct, in accordance with at least one of said codes, memory locations whereat pointers indicate that errors are suspected as having occurred;

means for evaluating said attempted correction and for determining whether said generated error pointers should be set; and, means for determining whether the usage of at least one of said codes resulted in the attempted correction of any suspected errors.

30. The apparatus of claim 29, further comprising:

means for communicating to said control means an indication of whether the implementation of a selected strategy resulted in any attempted corrections to said coded information in said data memory;

means for communicating to said control means an indication of whether any error pointers remain set in said pointer memory; and, mean for using at least one of said communicated indications to determine whether a further strategy is to be implemented.

* * * * *